(12) United States Patent
Yajima

(10) Patent No.: US 7,162,398 B2
(45) Date of Patent: Jan. 9, 2007

(54) METHOD FOR EVALUATING THE DYNAMIC PERSPECTIVE DISTORTION OF A TRANSPARENT BODY AND METHOD FOR SUPPORTING THE DESIGNING OF A THREE-DIMENSIONALLY CURVED SHAPE OF A TRANSPARENT BODY

(75) Inventor: Tatsuo Yajima, Aiko-gun (JP)

(73) Assignee: Asahi Glass Company, Limited, Tokyo (JP)

( * ) Notice: Subject to any disclaimer, the term of this patent is extended or adjusted under 35 U.S.C. 154(b) by 550 days.

(21) Appl. No.: 10/079,586

(22) Filed: Feb. 22, 2002

(65) Prior Publication Data

US 2002/0123868 A1 Sep. 5, 2002

Related U.S. Application Data

(63) Continuation of application No. PCT/JP01/05469, filed on Jun. 26, 2001.

(30) Foreign Application Priority Data

Jun. 27, 2000 (JP) .............................. 2000-193035

(51) Int. Cl.
G06F 17/50 (2006.01)
G02B 3/02 (2006.01)
G01R 31/00 (2006.01)

(52) U.S. Cl. ..................... 703/2; 359/720; 342/505

(58) Field of Classification Search ............ 703/2; 359/868, 720; 356/615, 616; 65/25.4; 324/505
See application file for complete search history.

(56) References Cited

U.S. PATENT DOCUMENTS

| 4,310,242 A | * | 1/1982 | Genco et al. ............ 356/128 |
| 5,307,141 A | | 4/1994 | Fujieda |
| 5,440,393 A | * | 8/1995 | Wenz .................... 356/611 |
| 5,568,258 A | * | 10/1996 | Uemura et al. ......... 356/237.1 |
| 5,812,260 A | | 9/1998 | Louisnathan |
| 6,208,412 B1 | * | 3/2001 | Ladewski .............. 356/239.1 |

FOREIGN PATENT DOCUMENTS

| JP | 2-223813 | 9/1990 |
| JP | 3-135704 | 6/1991 |
| JP | 6-241735 | 9/1994 |
| JP | 7-55786 | 3/1995 |
| JP | 11-3432 | 1/1999 |

OTHER PUBLICATIONS

Makiguchi et al., "A Human Factors Analysis of Optical Distortion for Automotive Windshields" International Congress & Exposition Detroit Michigan 1994 p. 47-57.*

(Continued)

Primary Examiner—Paul Rodriguez
Assistant Examiner—Thomas Stevens
(74) Attorney, Agent, or Firm—Oblon, Spivak, McClelland, Maier & Neustadt, P.C.

(57) ABSTRACT

A step of producing a model of three-dimensionally curved shape of a transparent body, a step of determining an eye point and a virtual evaluation pattern, a step of observing the virtual evaluation pattern through the transparent body and obtaining distance values of adjacent perspective evaluation points, a step of determining an optional value to be a reference value, among these distance values, and a step of evaluating the dynamic perspective distortion of the transparent body by obtaining ratios of the distance values to the reference value, are presented.

10 Claims, 9 Drawing Sheets

OTHER PUBLICATIONS

Seto et al., "A New Automatic Optical Distortion Measuring System for Automatic Windshields" International Congress & Exposition Detroit Michigan 1994 p. 59-64.*

Kurumisawa et al., "Development of an Optical Distortion Measureing Technique" May 1999 Res Center, Asahi Glass Co., p. 299-304.*

Patent Abstract of Japan, JP 06-241735, Sep. 2, 1994.

Patent Abstracts of Japan, JP 02-027232, Jan. 30, 1990.

"Optical Distortion Testing of Windshields HPW-TP-0600.02", H. P. White Laboratory, Inc., XP-002355099, Sep. 1993, The whole document.

* cited by examiner

MAXIMUM VALUE OF GRID DISTANCE
(DYNAMIC DISTORTION)
$\mathrm{Max}[d_i/d_4(i=1\sim n)]$ Dyamic distortion value Sensory evaluation test
(5-step evaluation)

METHOD FOR EVALUATING THE DYNAMIC PERSPECTIVE DISTORTION OF A TRANSPARENT BODY AND METHOD FOR SUPPORTING THE DESIGNING OF A THREE-DIMENSIONALLY CURVED SHAPE OF A TRANSPARENT BODY

TECHNICAL FIELD

The present invention relates to a method for evaluating the dynamic perspective distortion of a transparent body and a method for supporting the designing of a three-dimensionally curved shape of a transparent body.

BACKGROUND ART

In manufacturing automobiles or the like, a window glass having a complicated three-dimensional shape has been used from demands on design and aerodynamics etc. in recent years. When an object is seen through such window glass with a three-dimensionally curved plane, the object is sometimes seen to have a distortion. This phenomenon is called a perspective distortion phenomenon, and it is known that the phenomenon is caused at a non-parallel portion or a curved plane portion in a glass sheet. Since the perspective distortion is a factor of hindering visibility, in particular, in driving an automobile, the permissible maximum value of the perspective distortion is ruled in JIS (Japanese Industrial Standards).

The perspective distortion is evaluated by inspecting the optical performance of an intended glass sheet, or examining sensually an intended glass sheet. In recent years, there is a technique of evaluating the perspective distortion based on a model of three-dimensional shape of a glass sheet produced by CAD (Computer Aided Design), instead of the conventional optical performance test or sensory examination.

These conventional evaluation methods evaluate the perspective distortion in a case that a stationary object is seen through a glass sheet (hereinbelow, referred to as the static perspective distortion). Accordingly, it is suitable in a case of evaluating the perspective distortion of a glass sheet used for a building. However, a problem would arise in a case of evaluating the perspective distortion of a glass sheet used for a movable body such as an automobile.

Namely, the evaluation of the static perspective distortion is as a result of evaluating the perspective distortion at a large number of points in a local portion of the glass sheet independently, and it is not as a result of considering the continuity of the perspective distortion between a plurality of points. Accordingly, in a glass sheet wherein the perspective distortion of each local portion satisfies a predetermined prescribed value, there is a case that a change of the perspective distortion between adjacent local portions is large. In such case, when a scenery outside the movable body is seen through such glass sheet, the perspective distortion of an image changes largely with the movement of the movable body, and undulation is recognized.

The important inspection item of a movable body such as an automobile is, in addition to evaluating the static perspective distortion of an object in a stationary state when it is seen through a glass sheet, to evaluate the perspective distortion of the object seen through the glass sheet in a state of being driven (hereinbelow, referred to as the dynamic perspective distortion).

Further, in recent years, a technique of designing a three-dimensional shape of a glass sheet by CAD has widely been used. Accordingly, it is desirable to optimize the shape of the glass sheet in consideration of an evaluation result of the dynamic perspective distortion at the stage of designing.

The present invention has been achieved in consideration of the above-mentioned circumstances, and it is a primary object to provide a method for evaluating the dynamic perspective distortion of an object in a case that a scenery outside the movable body is seen through a transparent body such as glass. Further, it is secondary object of the present invention to provide a method for determining a three-dimensional shape of a transparent body based on an evaluation result of the dynamic perspective distortion.

DISCLOSURE OF THE INVENTION

According to the present invention, there is provided a method for evaluating the dynamic perspective distortion of a transparent body, which comprises a step of producing a model of three-dimensionally curved shape of a transparent body having a predetermined refractive index; a step of determining an eye point at a side of the model of three-dimensionally curved shape and a virtual evaluation pattern having a plurality of evaluation points at the other side of the model of three-dimensionally curved shape; a step of observing, from the eye point, the virtual evaluation pattern through the transparent body, extracting perspective evaluation points as images of the evaluation points, obtained by observing through the transparent body, in a two-dimensional picture image obtained by the observation, and obtaining distance values of adjacent perspective evaluation points; a step of determining an optional value to be a reference value, among these distance values, and a step of evaluating the dynamic perspective distortion of the transparent body by obtaining ratios of the distance values to the reference value.

In an aspect of the present invention, there is provided the method for evaluating the dynamic perspective distortion of a transparent body, wherein the dynamic perspective distortion of the transparent body is evaluated based on the rate of change of the ratios of the distance values to the reference value.

Further, there is provided the method for evaluating the dynamic perspective distortion of a transparent body, wherein the minimum value among the distance values is selected as the reference value, and the dynamic perspective distortion of the transparent body is evaluated based on the maximum value among the ratios of the distance values with respect to the minimum value.

Further, there is provided the method for evaluating the dynamic perspective distortion of a transparent body, wherein the virtual evaluation pattern is an orthogonal grid pattern.

Further, there is provided the method for evaluating the dynamic perspective distortion of a transparent body, wherein the transparent body is at least one selected from a glass sheet and a resinous plate.

Further, there is provided the method for evaluating the dynamic perspective distortion of a transparent body, wherein the image seen through the model of three-dimensionally curved shape of the transparent body is animation-displayed.

Further, according to the present invention, there is provided a method for supporting a model of three-dimensionally curved shape of a transparent body, which comprises a step of producing a model of three-dimensionally curved shape of a transparent body having a predetermined refractive index; a step of determining an eye point at a side of the model of three-dimensionally curved shape and a virtual evaluation pattern having a plurality of evaluation points at the other side of the model of three-dimensionally curved shape; a step of observing, from the eye point, the virtual evaluation pattern through the transparent body, extracting perspective evaluation points as images of the evaluation points, obtained by observing through the transparent body, in a two-dimensional picture image obtained by the observation, and obtaining distance values of adjacent perspective evaluation points; a step of determining an optional value to be a reference value, among these distance values; a step of evaluating the dynamic perspective distortion of the transparent body by obtaining ratios of the distance values to the reference value, and a step of correcting the three-dimensionally curved shape of the transparent body according to the evaluation.

Further, in an aspect of the present invention, there is provided the method for supporting the designing of the three-dimensionally curved shape of a transparent body, wherein the dynamic perspective distortion of the transparent body is evaluated based on the rate of change of the ratios of the distance values to the reference value.

Further, there is provided the method for supporting the designing of the three-dimensionally curved shape of a transparent body, wherein the minimum value among the distance values is selected as the reference value, and the dynamic perspective distortion of the transparent body is evaluated based on the maximum value among the ratios of the distance values with respect to the minimum value.

Further, there is provided the method for supporting the designing of the three-dimensionally curved shape of a transparent body, wherein the virtual evaluation pattern is an orthogonal grid pattern.

Further, there is provided the method for supporting the designing of the three-dimensionally curved shape of a transparent body, wherein the transparent body is at least one selected from a glass sheet and a resinous plate.

Further, there is provided the method for supporting the designing of the three-dimensionally curved shape of a transparent body, wherein the image seen through the model of three-dimensionally curved shape of the transparent body is animation-displayed.

DETAILED DESCRIPTION OF THE PREFERRED EMBODIMENTS

BEST MODE FOR CARRYING OUT THE INVENTION

Figure 1A:
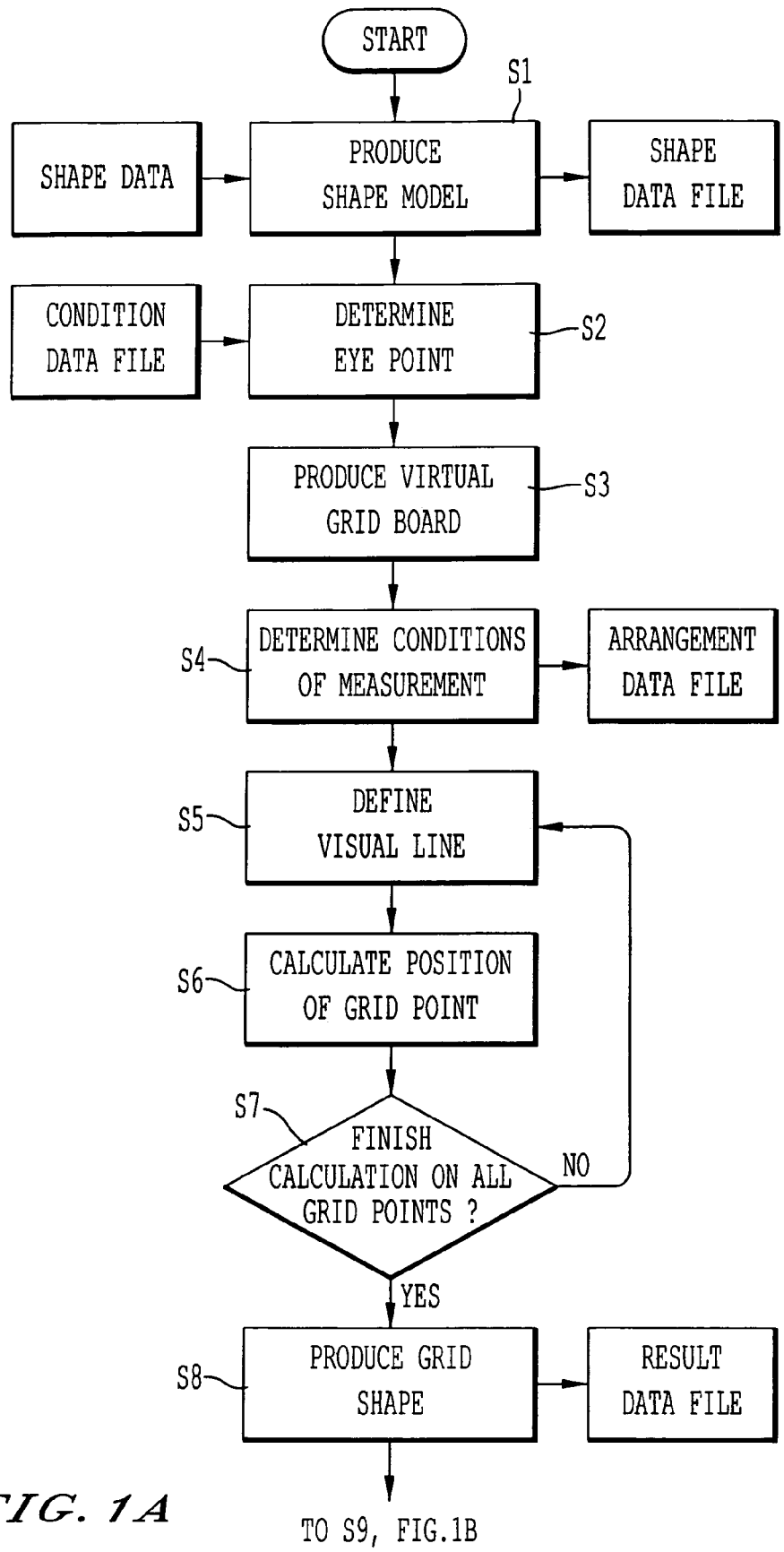
FIGS. 1A–1C depict a flowchart showing the process of the method for evaluating the dynamic perspective distortion of a transparent body according to an embodiment of the present invention.

In the following, some embodiments of the present invention will be described with reference to the drawing.

Figure 1B:
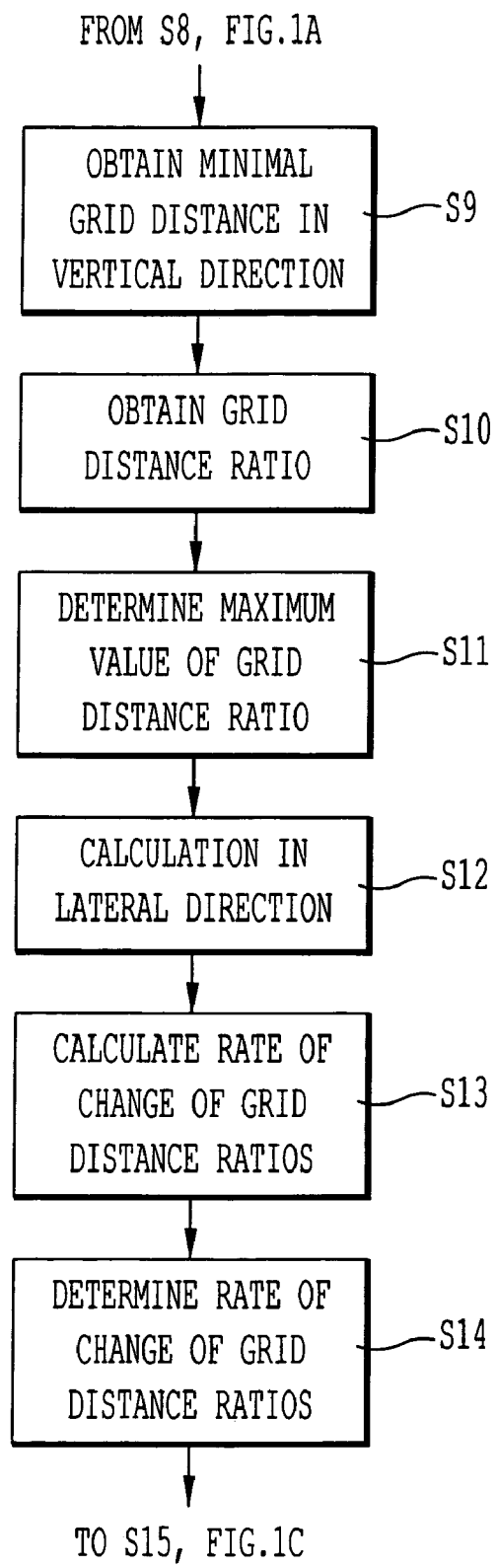
Figure 1C:
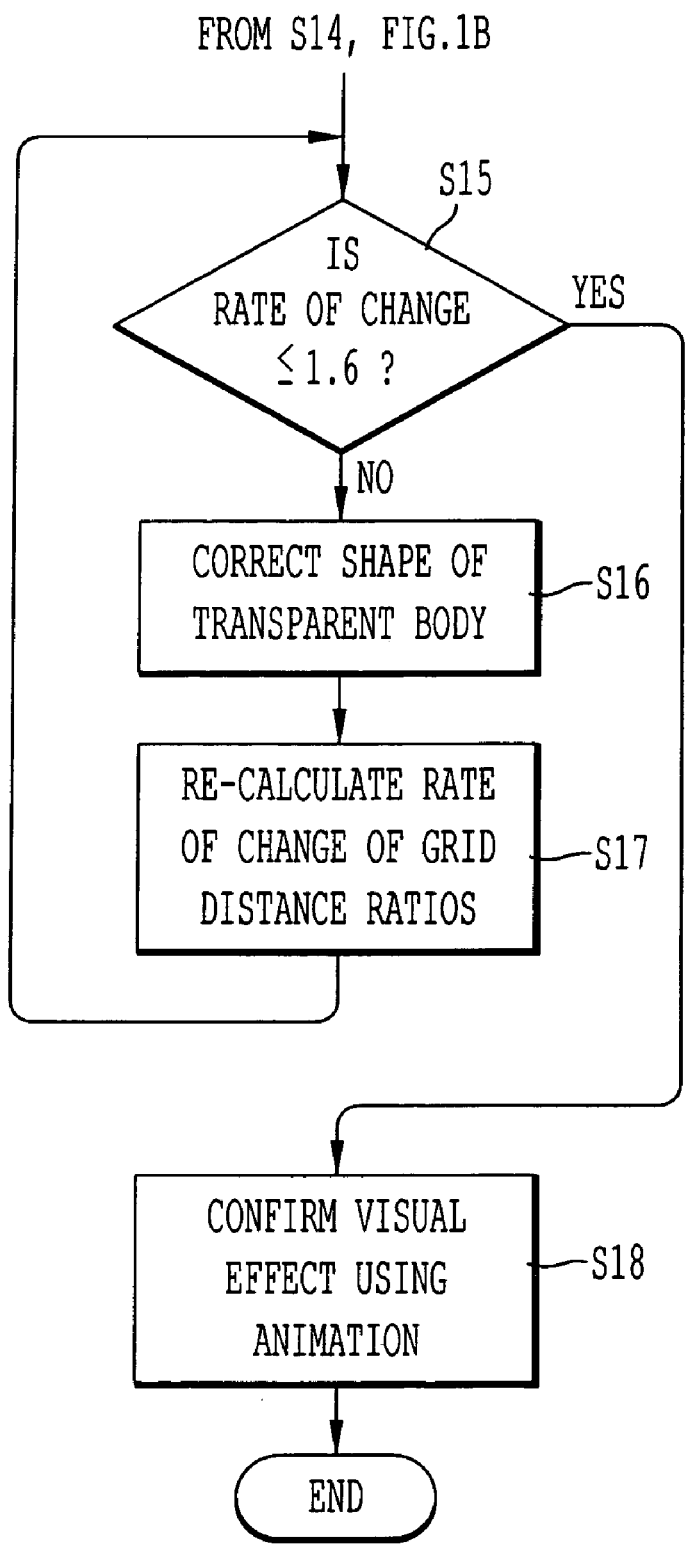
Figure 2:
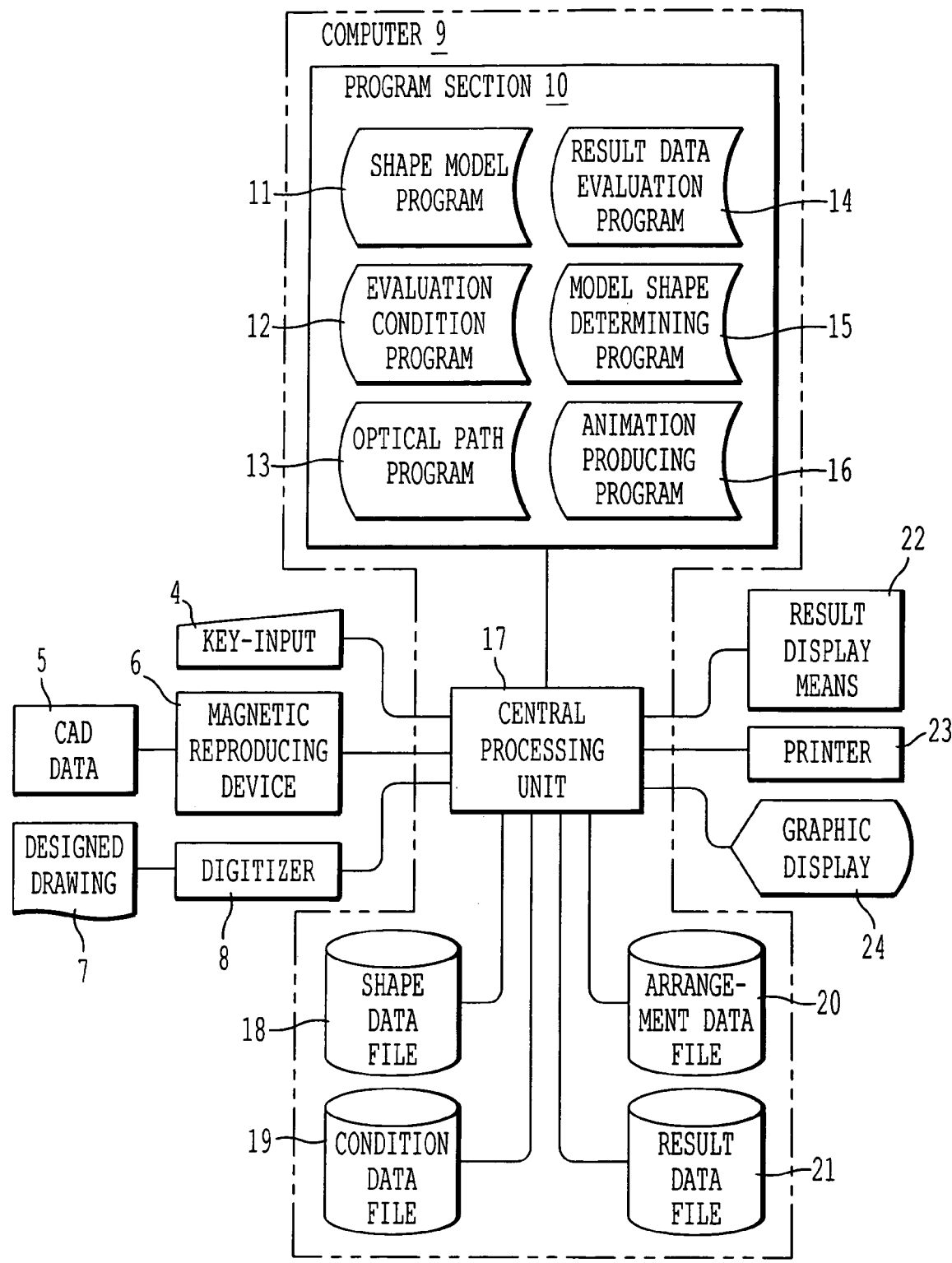
FIG. 2 is a constitution diagram showing an evaluation system for carrying out the evaluation method shown in FIGS. 1A–1C.
Figure 3:
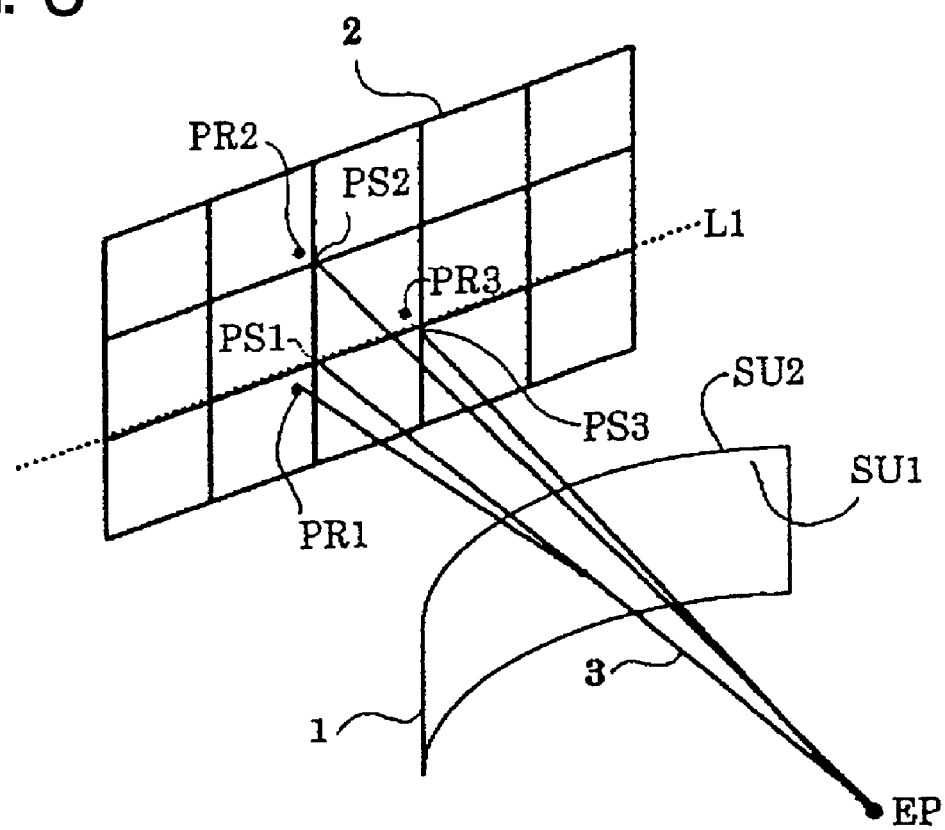
FIG. 3 is a constitution diagram showing an evaluation model.

FIGS. 1A–1C are flowcharts showing the method of evaluation of the dynamic perspective distortion according to an embodiment of the present invention. FIG. 2 is a block diagram showing an evaluation system for carrying out the method for evaluating the dynamic perspective distortion shown in FIGS. 1A–1C. FIG. 3 shows an evaluation model.

First, a model of three-dimensionally curved shape of a transparent body (such as a glass sheet or a resinous plate) is produced by reading out the data of shape by means of an input device, a memory device or the like (Step S1). The method for inputting the data of shape is well known, and CAD data 5 may be inputted into a computer 9 with a magnetic tape or the like by means of a magnetic reproducing device 6, or data obtained by plotting a designed drawing 7 with a digitizer 8 may be inputted into the computer 9, as shown in FIG. 2. Further, a known technique can be used for producing the three-dimensionally curved shape of the transparent body. For example, three-dimensional coordinate data of a large number of points on a plan view and a side view, called a Mylar diagram, of the transparent body are inputted into the computer 9.

Then, a central processing unit 17, which has received input data, produces grid-like three-dimensional spline curves passing a train of points; divides a curved plane into rectangular patches defined by the spline curves as boundaries, and produces a dual third parametric curved plane like a Coons plane which is expressed by parameters along each side of patches. And, it renders the curved plane to be the shape model of an inner surface of a plate-like transparent body, and produces the shape model of an outer surface by offsetting the shape model of the inner surface by the thickness of the transparent body. The finally determined shape model is obtainable by combining the shape models of the inner and outer surfaces.

The data of the obtained shape model are stored in a shape data file 18. The above-mentioned series of works for producing the model of three-dimensionally curved shape are carried out by the central processing unit 17 which reads out for execution a program stored as a shape model producing means 11 in a program section 10 of the computer 9.

The central processing unit 17 determines an eye point EP (Step S2) and produces virtual grid board (Step S3) based on data in a condition data file 19 in which determination conditions previously inputted by a key-input means 4 are stored. In this embodiment, a virtual grid board 2 (see FIG. 3) is assumed for a virtual evaluation pattern, and grid points (PS1, PS2 and PS3) are assumed as evaluation points. However, another evaluation pattern having regularly arranged points in lateral and vertical directions may be used. Evaluation points seen from the eye point EP become grid points (PR1, PR2 and PR3 (hereinbelow, referred to as perspective evaluation point)) due to the refraction index of the transparent body.

Further, based similarly on the data in the condition data file 19, the fitting angle of the shape model of the transparent body; the distances between the eye point EP and the shape model 1 of the transparent body and between the eye point and the virtual grid board 2, and the grid distance of the virtual grid board 2 are determined. As described above, all conditions before the initiation of the measurement are determined, and obtained arrangement data are stored in an arrangement data file 20 (Step S4).

A series of these works for determining evaluation conditions are carried out by the central processing unit 17 which reads out for execution a program stored as an evaluation condition determining means 12 in the program section 10 of the computer 9.

Then, the computer 9 calls an optical path tracing/calculating means 13 in the program section 10 to define a virtual line with respect to the shape model 1 of the transparent body by using the arrangement data on the shape model 1 of the transparent body, the eye point EP and the virtual grid board 2 (Step S5), and to conduct calculation for obtaining a perspective distortion due to the refraction (a deviation of the position of a grid point observed from the eye point EP) (Step S6). The calculation of the deviation of the position of a grid point is, in principle, conducted by utilizing the fact that the propagating direction of a light beam is different due to the refraction effect depending on the presence or absence of the shape model 1 of the transparent body.

Figure 4:
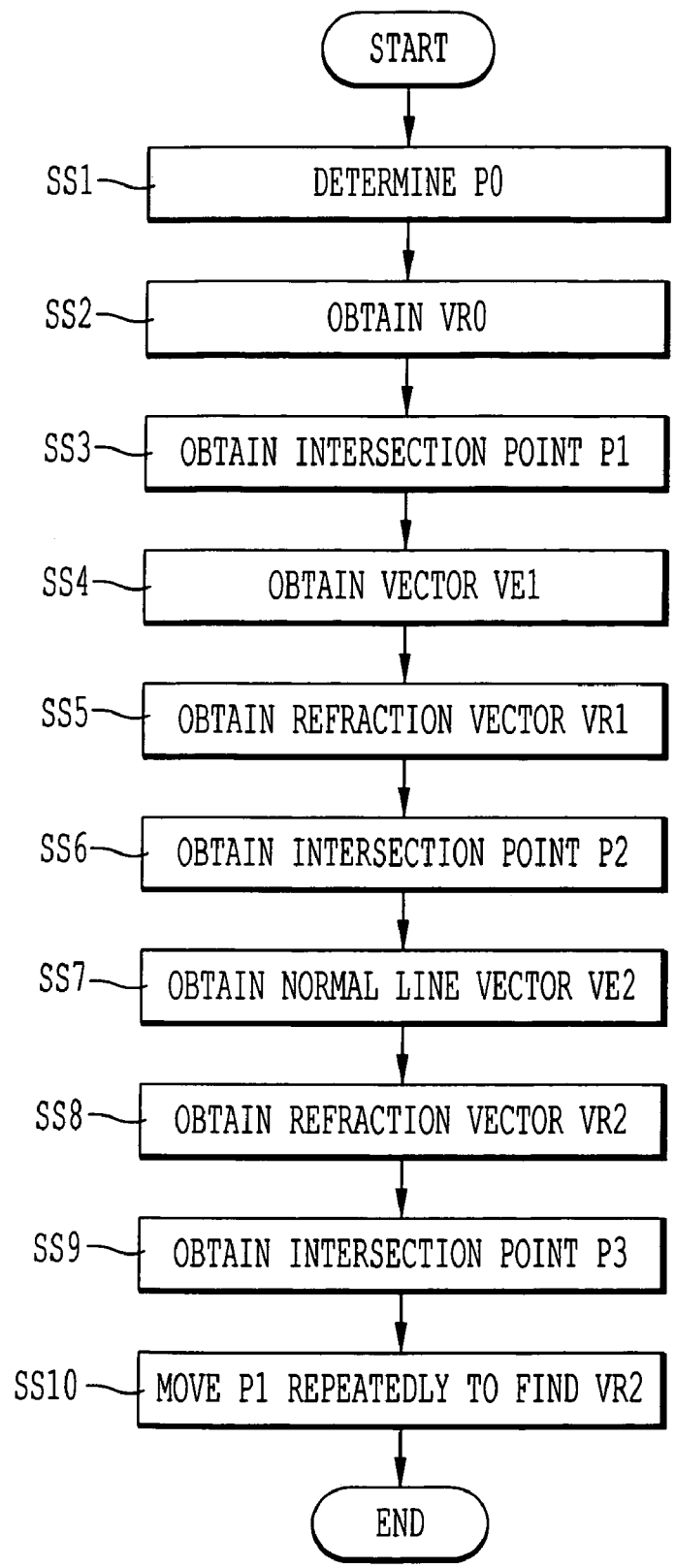
FIG. 4 is a flowchart showing the process of calculation for obtaining a deviation of the position of a grid point seen through the transparent body.
Figure 5:
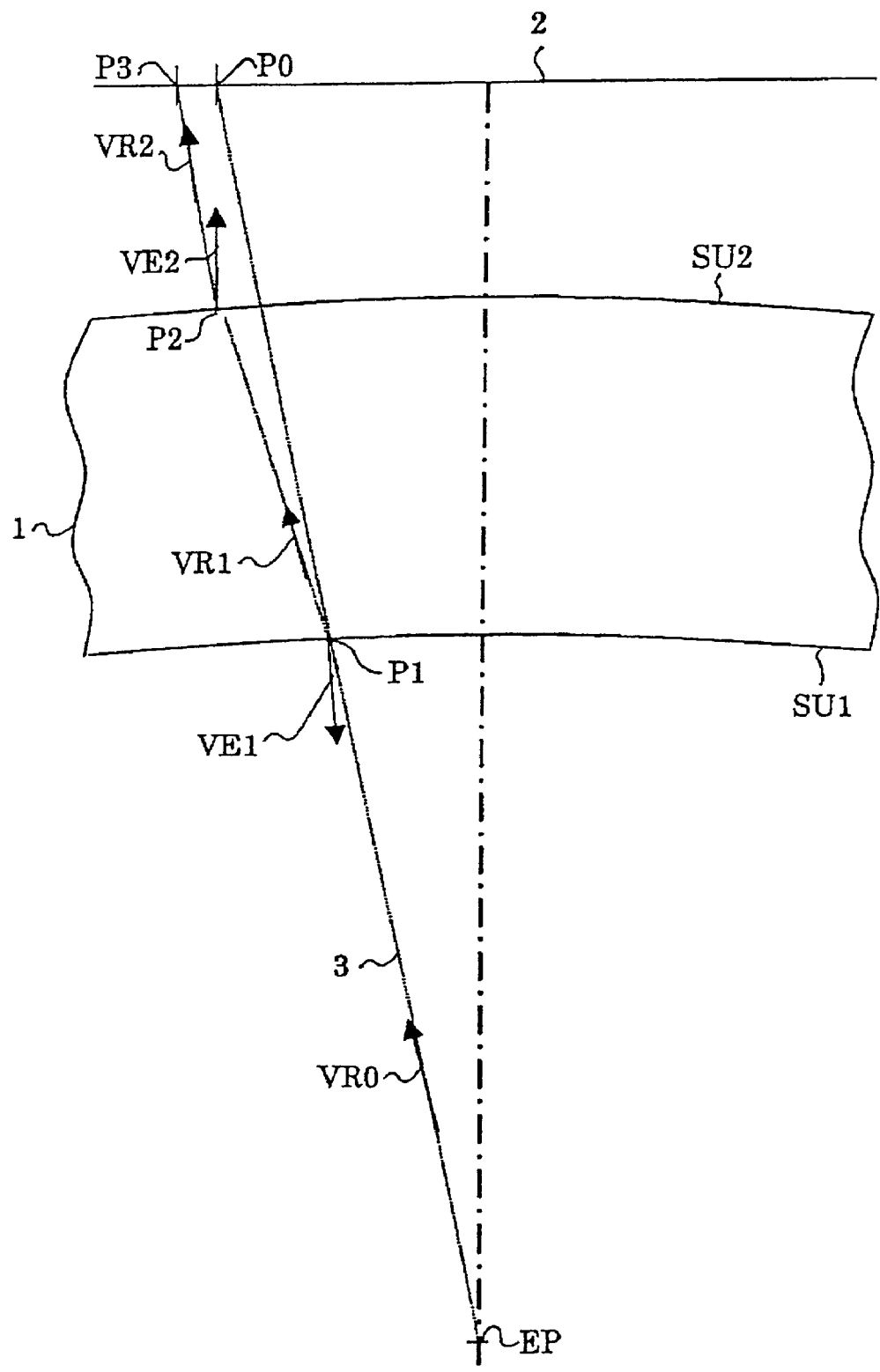
FIG. 5 is a diagram showing the process of calculation for obtaining a deviation of the position a grid point seen through the transparent body.

FIG. 4 shows concretely the flow of the calculation. Further, the tracing of the optical path is explained in detail by using FIG. 5. First, an optional grid point P0 is determined on the virtual grid board 2 (Step SS1). Then, a vector VR0 in the propagating direction of a virtual light beam 3 directing from the eye point EP toward P0 is obtained (Step SS2). Then, the intersection point P1 between a linear line passing through the eye point EP and having the same direction as the vector VR0 and an inner surface SU1 of the shape model 1 of the transparent body is obtained (Step SS3), and a vector VE1 along the normal line of the inner surface of the shape model 1 of the transparent body at the intersection point P1 is obtained (Step SS4).

Further, based on the vector VR0 and the vector VE1 and according to the law of refraction, a vector VR1 which indicates the propagating path after the virtual light beam 3 is refracted at the outer surface SU2 of the shape model 1 of the transparent body, is obtained (Step SS5). Namely, when the incident angle (with respect to the normal line) of the virtual light beam 3 from the eye point EP to the inner surface SU1, is assumed i, the refractive angle (with respect to the normal line) of the virtual light beam 3 at the inner surface SU1 is r and the refractive index of the transparent body to air is n, $\sin i / \sin r = n$ is established, and accordingly, the refractive angle r can be obtained from the known vector VR0, vector VE1 and the refractive index n. Thus, the vector VR1 is obtainable based on these.

Then, the intersection point P2 between a linear line passing through the intersection point P1 and having the same direction as the vector VR1 and an outer surface SU2 of the shape model 1 of the transparent body is obtained (Step SS6), and a vector VE2 along the normal line on the outer surface SU2 of the shape model 1 of the transparent body at the intersection point P2 is obtained (Step SS7). Further, based on the vector VR1 and the vector VE2 and according to the above-mentioned law of refraction, a vector vR2 which indicates the propagating path after the virtual light beam 3 is refracted at the outer surface SU2 of the shape model 1 of the transparent body, is obtained (Step SS8). Then, the intersection point P3 between a linear line passing through the intersection point P2 and having the same direction as the vector VR2 and the virtual grid board 2, is obtained (Step SS9).

After this, the position of P1 is shifted so that P3 approaches P0, and P3 is again obtained according to the above-mentioned Steps SS1 to SS9. Namely, P1 is moved by a distance shorter than a line segment P3P0 in the direction of a vector P3P0 to determine a fresh P1 (hereinbelow, referred to as $P1_1$), so that P3 is again obtained. As a result, when the line segment P3P0 is shorter than a previously determined length (hereinbelow, referred to as P3≈P0), $P1_1$ is replaced by P1, and VR2 is obtained. If P3≈P0 is not established, a fresh P1 ($=P1_2, \ldots, P1_n$ (n: an arbitrary natural number)) is determined to repeat the above-mentioned steps until P3≈P0 can be established (Step SS10).

As described above, the position of the intersection point (virtual point) P1 can be in approximation the position where the virtual point P0 can actually be observed from the eye point EP.

With respect to all the other grid points, intersection points corresponding to respective grid points are obtainable by executing Steps SS1 to SS10 (Step S7). By connecting these intersection points, a fresh shape of the grids can be constructed (Step S8). The data of the intersection points are stored in a result data file 21.

Then, the dynamic distortion value as a parameter for evaluating the dynamic perspective distortion and the intensity of the dynamic distortion value are obtained. In this embodiment, the program for obtaining each parameter is stored in a result data evaluation means 14 in the program section 10. First, based on the above-mentioned result data, the narrowest grid distance in a vertical direction among grid distances (between the intersection points) which are seen from the transparent body, is calculated. For example, explanation is made assuming that perspective evaluation points PR1, PR2 and PR3 as intersection points corresponding to three grid points PS1, PS2 and PS3 in FIG. 3, have been obtained. In this case, the distance between the perspective evaluation points PR1 and PR2 is the grid distance in a vertical direction. The distance can be obtained from the coordinate values of two points. By obtaining all grid distances in the vertical direction as described, the minimum value among them can be found (Step S9).

Figure 6:
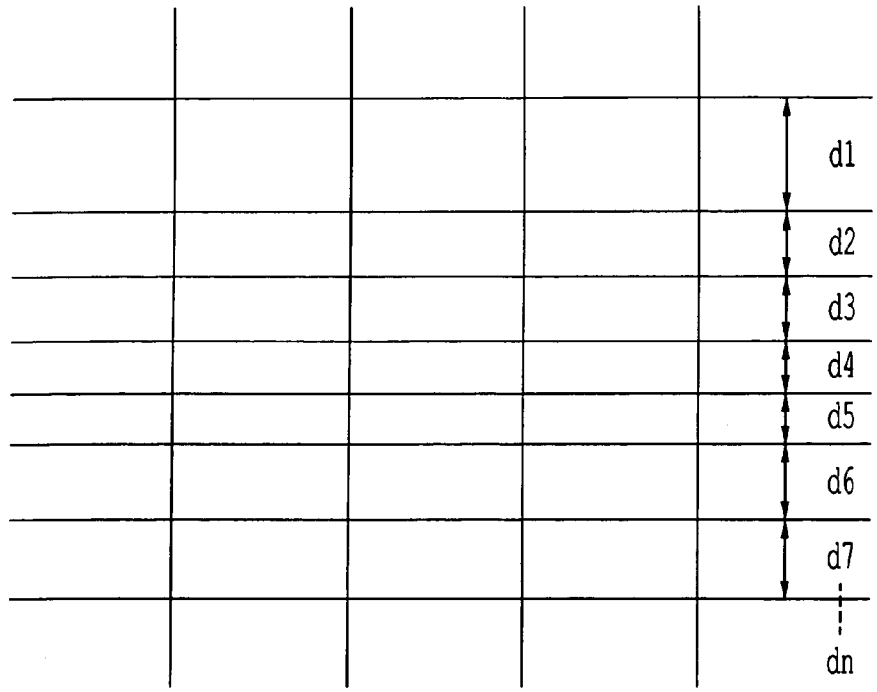
FIG. 6 is a diagram showing an evaluation pattern formed freshly according to the evaluation model.

FIG. 6 shows an evaluation pattern formed freshly from the evaluation model wherein d1 to dn indicate grid distances in a vertical direction. In FIG. 6, the minimum value of the grid distance is indicated by d4. By dividing each of the other grid distances by the minimum value, grid distance ratios di/d4 (i=1 to n, n: the number of grids) can be obtained (Step S10). The maximum value of the grid distance ratios is determined to be a dynamic distortion value (Step S11).

Then, a dynamic distortion value is also obtained in a lateral direction in the same manner. First, a grid distance in a lateral direction is obtained. In the example of FIG. 3, the distance between perspective evaluation points PR1 and PR3 is the grid distance in the lateral direction. By obtaining all grid distances in the lateral direction as described, the minimum value among them can be found. By dividing each of the other grid distances by the minimum value, grid distance ratios can be obtained. The maximum value among them is determined to be a dynamic distortion value (Step S12).

In this embodiment, the minimum value of grid distances is determined to be the reference value and each grid distance ratio can be obtained by dividing each of the other grid distances in vertical and lateral directions by the reference value. The maximum value among them is defined as the dynamic distortion value. However, the dynamic distortion value is a relative value based on the ratio of the reference value which is an optional one among the grid distances, to the other grid distance. Accordingly, the dynamic distortion value may be determined irrespective of this embodiment. As in this embodiment, when the reference value is determined as the minimum value of the grid distances and the maximum value is determined in the relation of the other grid distances to the minimum value, the calculation in the determination of the minimum value can quickly and easily be performed. Further, the difference between an expansively visible portion and a diminutively visible portion due to the perspective distortion can easily be expressed numerically.

Figure 7:
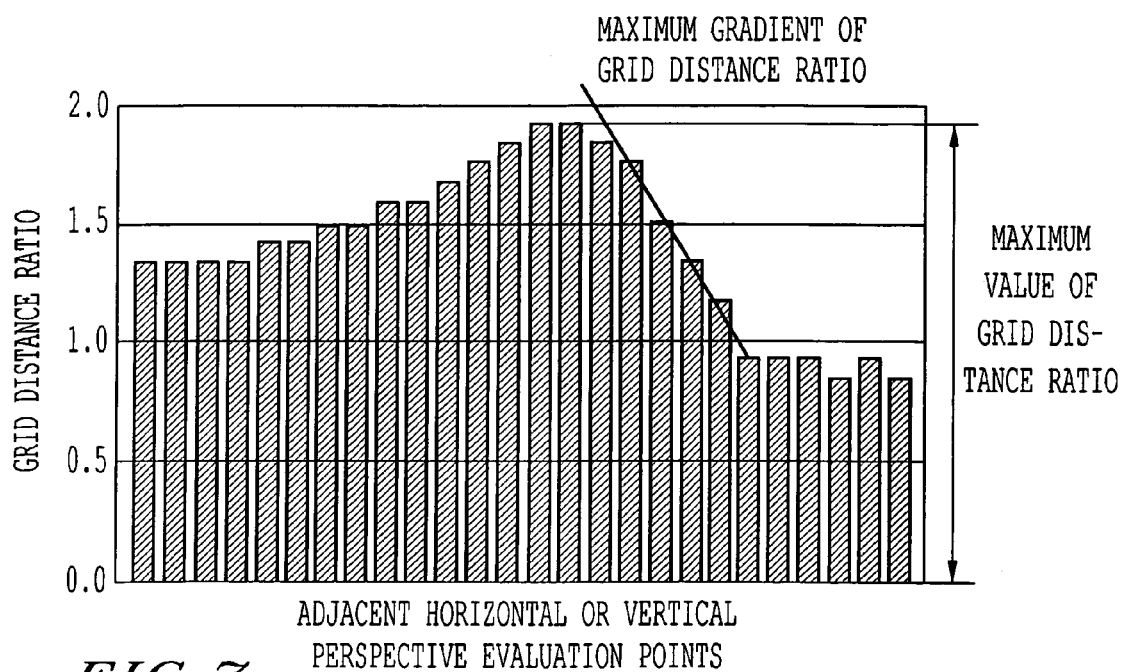
FIG. 7 is a graph showing grid distance ratios in lateral directions.

Then, the rate of change of the grid distance ratios in both the vertical and lateral directions (two-dimensional direction) is calculated (Step S13). For example, the grid distance ratios are placed in the order from left to right in the direction of a linear line L1 which traverses laterally the virtual grid board 2 in FIG. 3. FIG. 7 is a graph showing such state which is obtainable by selecting a region wherein the gradient seems to be the largest, and applying a least squares method or a suitable method to the grid distance ratio of this region. The rate of change of the grid distance ratios is calculated as the gradient based on the graph, and the maximum value of the gradient is determined as the intensity of the dynamic distortion (Step S14). As the rate of change is larger, the difference of the perspective distortion between that portion and surroundings is larger. Even though there are some dynamic distortion values (the maximal grid distance ratio values), flickering in view of an object seen through the transparent body from a movable body is apt to be realized if the rate of change is larger. By the introduction of this rate of change, the continuity of the perspective distortion is taken into consideration whereby the evaluation of the dynamic perspective distortion becomes possible.

Thus, the processes for obtaining the dynamic distortion value and the intensity of the dynamic distortion value are finished about a single shape model. The obtainable result is preserved in the result data file 21 by means of the result data evaluation means 14.

It is desirable that the data of grid distance ratios, the dynamic distortion values, the rates of change of the grid distance ratios and so on, which are obtained respectively, are displayed by a result display means 22 or printed by a printer 23 occasionally in the form of a distribution map of the grid distance ratios or a graph of the rates of change of the grid distance ratios, although the flowchart in FIG. 1 does not show specifically.

Then, the computer calls a model shape determining means 15 in the program section 10. In this program, the obtained dynamic distortion value is compared with a previously determined threshold value (Step S15). When it is lower than the threshold value, a judgement of acceptance is made whereby the operation of judgement is finished. When it is higher than the threshold value, a judgement of rejection is made whereby the operation of shape adjustment is carried out on CAD (Step S16). In the adjustment, the portion of the shape model which corresponds to a portion where the grid distance becomes maximal, is displayed, and it is requested to change the surface curvature and the trim shape of that portion. After the adjustment, the above-mentioned data processing is carried out to obtain the dynamic distortion value (Step S17). Simulation and adjustment are repeated until a value lower than the threshold value can be obtained. Thus, the optimum shape can be obtained.

Finally, the computer 9 calls an animation producing means 16 in the program section 10. A scenery seen through the accepted shape model of the transparent body from, for example, a cruising automobile is displayed in the form of an animation image in a graphic display 24 in order to confirm visually that the adjustment has been completed. The animation display is conducted by utilizing the result data stored in the result data file 21. The operation for the shape model before the adjustment is also conducted similarly. Namely, a scenery seen through the transparent body from, for example, a cruising automobile is displayed in the form of an animation image such as CG (Computer Graphics) or the like, in the graphic display 24. As a result, a user can confirm effectively adjustment effect by comparing the animation image after the adjustment with that before the adjustment.

Figure 8A:
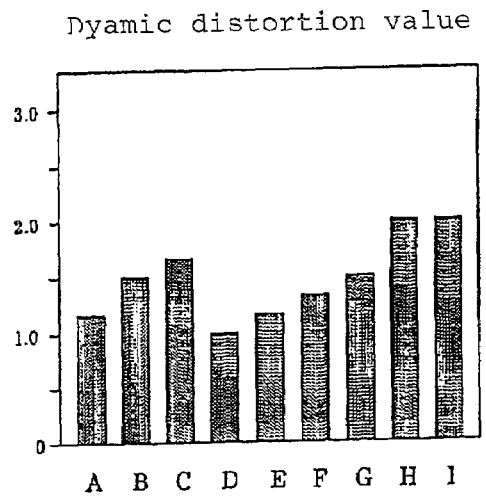
FIG. 8A is a graph showing a result of calculation of dynamic distortion values.
Figure 8B:
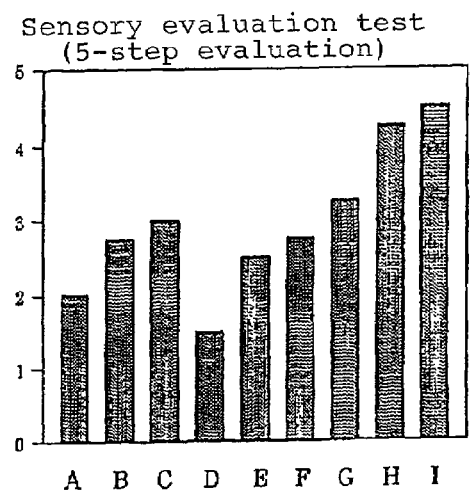
FIG. 8B is a graph showing a result of measurement of the dynamic perspective distortion in a sensory evaluation test.

In the following, explanation will be made as to a method for determining the threshold value in the judgement of shape which is carried out in this embodiment. Shape models were prepared using a large number of actual transparent bodies, and the dynamic distortion values were calculated on the shape models respectively (FIG. 8A). At the same time, sensory evaluation tests for 5-step evaluation were conducted to a plurality of tested persons to examine the feeling of flickering in a case that a moving object was actually seen through these transparent bodies (FIG. 8B).

In both graphs, the abscissa indicates samples A to I and the ordinate indicates the dynamic distortion value. As clear from the comparison of these graphs, it could be confirmed that the dynamic distortion value has extremely high correlation to the evaluation by actual observation by eye, namely, the value was an index which sufficiently reflected the dynamic perspective distortion. Then, based on the fact that the sample H and the sample I were judged as no good in the sensory evaluation tests, the threshold value of the dynamic distortion value was determined to be 1.6.

Figure 9:
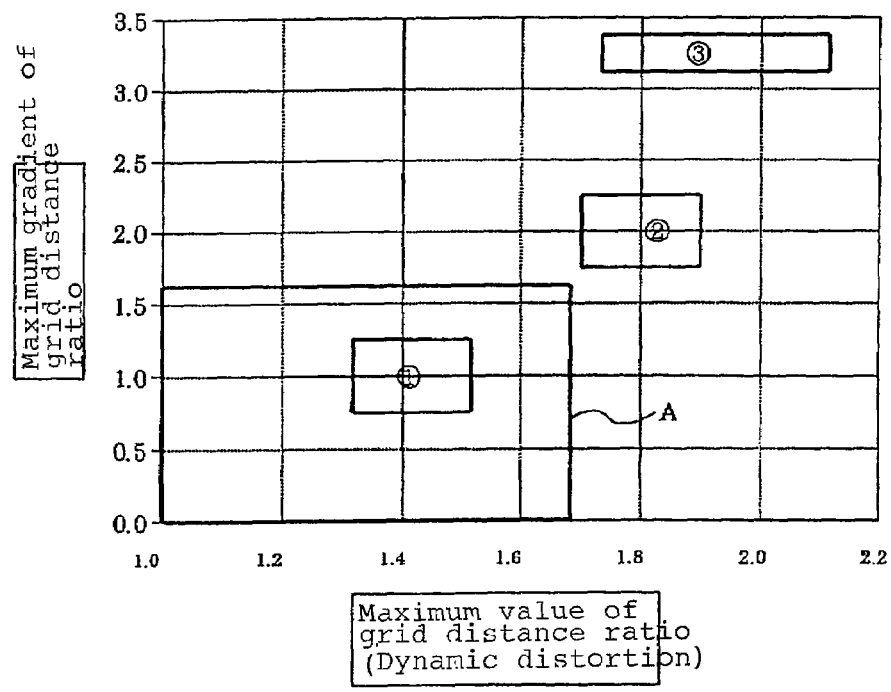
FIG. 9 is a graph showing the relation between the dynamic distortion value of the transparent body and the intensity of the dynamic distortion.

In the measurement of the intensity of the dynamic distortion (the maximum gradient of the grid distance ratios), in addition to the dynamic distortion value (the maximum value of the grid distance ratios), on the large number of transparent bodies, there was found distribution in a region ① to a region ③ in FIG. 9. From the visual confirmation by the above-mentioned animation and the actual evaluation, the range of a region A in which flickering was hardly realized was determined to be the reference of judgement. By conducting the double judgement in terms of the dynamic distortion value and the intensity of the dynamic distortion, it is possible to obtain a highly accurate evaluation in a step of designing.

INDUSTRIAL APPLICABILITY

According to the present invention, it is possible to quantify the dynamic perspective distortion (the dynamic distortion value and the intensity of the dynamic distortion) of a transparent body, which has not been used for the evaluation, and evaluation can be conducted with higher reliability than conventional technique to the dynamic perspective distortion which is caused when outward things are seen through a transparent body such as glass, resin or the like from a movable body such as an automobile. Further, the feedback to the manufacturing process can be easily with the improvement of accuracy in designing; the yield percentage and the quality can be improved; cost for unnecessary manufacture of mold or modification of mold can be reduced to reduce cost, and the flexibility of designing can be expanded. Accordingly, the present invention is in particular effective for large item small scale production.

The entire disclosure of Japanese Patent Application No. 2000-193035 filed on Jun. 27, 2000 including specification, claims, drawings and summary are incorporated herein by reference in its entirety FIG. 1 (attached sheet)

| | |
|---|---|
| 1A | Shape data |
| 1B | Condition data file |
| | Attribution of transparent body |
| | Definition of measurement position |
| S1 | Producing shape model |
| S2 | Determining eye point |
| S3 | Producing virtual grid board |
| S4 | Determining conditions of measurement |
| | Fitting angle of transparent body |
| | Distance between eye point and transparent body and between eye point and virtual grid board |
| | Grid distance of grid board |
| S5 | Defining visual line to transparent body |
| S6 | Calculating position of grid point seen through transparent body by tracing refracted light |
| S7 | Finishing calculation on all grid points |
| S8 | Producing grid shape seen through transparent body |
| S9 | Obtaining minimum value of grid distance in vertical direction |
| S10 | obtaining grid distance ratio by dividing each grid distance by minimum value |
| S11 | Determining maximum value of grid distance ratio to be dynamic distortion value |
| S12 | Calculation in lateral direction |
| 1C | Shape data file |
| 1D | Arrangement data file |
| 1E | Result data file |
| S13 | Calculating rate of change of grid distance ratio in vertical and lateral directions |
| S14 | Determining rate of change of grid distance ratios to be dynamic distortion intensity |
| S15 | Is dynamic distortion value 1.6 or less? |
| S16 | Correcting shape of transparent body, surface curvature and trim, by CAD |
| S17 | Re-calculating dynamic distortion value |
| S18 | Confirming visually effect by animation |
| 1F | End |

FIG. 2 (attached sheet)

| | |
|---|---|
| 4 | Key-input means |
| 5 | CAD data |
| 6 | Magnetic reproducing device |
| 7 | Designed drawing |
| 8 | Digitizer |
| 9 | Computer |
| 10 | Program section |
| 11 | Shape model producing means |
| 12 | Evaluation condition determining means |
| 13 | Optical path tracing/calculating means |
| 14 | Result data evaluation means |
| 15 | Model shape determining means |
| 16 | Animation producing means |
| 17 | Central processing unit |
| 18 | Shape data file |
| 19 | Condition data file |
| 20 | Arrangement data file |
| 21 | Result data file |
| 22 | Result display means |
| 23 | Printer |
| 24 | Graphic display |

FIG. 4 (attached sheet)

| | |
|---|---|
| SS1 | Determining P0 |
| SS2 | Obtaining VR0 directing from EP toward P0 |
| SS3 | Obtaining an intersection point P1 at the intersection of VR0 to an inner surface SU1 of the shape model |
| SS4 | Obtaining a normal line vector VE1 on the inner surface SU1 at P1 |
| SS5 | Obtaining a refraction vector VR1 from VR0 and VE1 |
| SS6 | Obtaining an intersection point P2 at the intersection of VR1 to an outer surface SU2 of the shape model |
| SS7 | Obtaining a normal line vector VE2 on the outer surface SU2 at P2 |
| SS8 | Obtaining a refraction vector VR2 from VR1 and VE2 |
| SS9 | Obtaining an intersection point P3 at the intersection of the line passing through VR2 to a grid broad 2 |
| SS10 | Moving repeatedly P1 to find VR2 so as to approach P3 ≈ P0, and repeating the above operation to find P1 so as to approach P3 ≈ P0 |

What is claimed is:

1. A computer-implemented method for evaluating dynamic perspective distortion of a transparent body comprising the steps of:

producing a model of three-dimensionally curved shape of a transparent body having a predetermined refractive index;

determining an eye point at a side of the model of three-dimensionally curved shape and a virtual evaluation pattern having a plurality of evaluation points at the other side of the model of three-dimensionally curved shape;

observing, from the eye point, the a virtual evaluation pattern through the transparent body, extracting perspective evaluation points as images of the evaluation points, obtained by observing through the transparent body, in a two-dimensional picture image obtained by the observation, and obtaining a plurality of distance values between a plurality of adjacent perspective evaluation points;

determining a reference value, among the plurality of distance values, and evaluating the dynamic perspective distortion of the transparent body by obtaining ratios of each of the plurality of distance values to the reference value, wherein the virtual evaluation pattern is an orthogonal grid pattern.

2. The computer-implemented method of claim 1, wherein:

the dynamic perspective distortion of the transparent body is evaluated based on the rate of change of each of the ratios of the plurality of distance values to the reference value.

3. The computer-implemented method of to claim 1, wherein:

a minimum value among the distance values is selected as the reference value, and the dynamic perspective distortion of the transparent body is evaluated based on a maximum value among the ratios of the distance values with respect to the minimum value.

4. The computer-implemented method of claim 1, wherein:

the transparent body is at least one selected from a glass sheet and a resinous plate.

5. The computer-implemented method of a transparent body according to claim 1, wherein:

the image seen through the model of three-dimensionally curved shape of the transparent body is animation-displayed.

6. A computer-implemented method for correcting a three-dimensionally curved shape of a transparent body, comprising the steps of:
  producing a model of three-dimensionally curved shape of a transparent body having a predetermined refractive index;
  determining an eye point at a side of the model of three-dimensionally curved shape and a virtual evaluation pattern having a plurality of evaluation points at the other side of the model of three-dimensionally curved shape;
  observing, from the eye point, the a virtual evaluation pattern through the transparent body, extracting perspective evaluation points as images of the evaluation points, obtained by observing through the transparent body, in a two-dimensional picture image obtained by the observation, and obtaining a plurality of distance values between a plurality of adjacent perspective evaluation points;
  determining a reference value, among the plurality of distance values;
  evaluating the dynamic perspective distortion of the transparent body by obtaining ratios of each of the plurality of distance values to the reference value, and
  correcting the three-dimensionally curved shape of the transparent body according to the evaluation, wherein the virtual evaluation pattern is an orthogonal grid pattern.

7. The computer-implemented method of claim 6, wherein:
  the dynamic perspective distortion of the transparent body is evaluated based on the rate of change of each of the ratios of the plurality of distance values to the reference value.

8. The computer-implemented method of claim 6, wherein:
  a minimum value among the distance values is selected as the reference value, and the dynamic perspective distortion of the transparent body is evaluated based on a maximum value among the ratios of the distance values with respect to the minimum value.

9. The computer-implemented method of claim 6, wherein:
  the transparent body is at least one selected from a glass sheet and a resinous plate.

10. The computer-implemented method of claim 6, wherein:
  tyhe image seen through the model of three-dimensionally curved shape of the transparent body is animation-displayed.

* * * * *